US006831391B2

(12) United States Patent
Miller et al.

(10) Patent No.: US 6,831,391 B2
(45) Date of Patent: Dec. 14, 2004

(54) MICROELECTROMECHANICAL SYSTEM FOR TILTING A PLATFORM

(75) Inventors: Samuel Lee Miller, Albuquerque, NM (US); Murray Steven Rodgers, Albuquerque, NM (US); Stephen Matthew Barnes, Albuquerque, NM (US); Jeffry Joseph Sniegowski, Edgewood, NM (US); Paul Jackson McWhorter, Albuquerque, NM (US)

(73) Assignee: MEMX, Inc., Albuquerque, NM (US)

( * ) Notice: Subject to any disclaimer, the term of this patent is extended or adjusted under 35 U.S.C. 154(b) by 0 days.

(21) Appl. No.: 10/697,386

(22) Filed: Oct. 30, 2003

(65) Prior Publication Data

US 2004/0090144 A1 May 13, 2004

Related U.S. Application Data

(62) Division of application No. 09/966,963, filed on Sep. 27, 2001.

(51) Int. Cl.$^7$ .............................. H02N 1/00; G02B 26/08
(52) U.S. Cl. ........................ 310/309; 359/225; 359/224; 385/18
(58) Field of Search ........................... 310/309; 385/16, 385/18; 359/223–225, 298, 872; 74/490.1–490.15; 182/182.1

(56) References Cited

U.S. PATENT DOCUMENTS

| | | | |
|---|---|---|---|
| 3,990,780 A | 11/1976 | Dakss | 350/96 |
| 4,208,094 A | 6/1980 | Tomlinson, III et al. | 350/96.2 |
| 4,365,863 A | 12/1982 | Broussaud | 350/96.15 |
| 4,838,631 A | 6/1989 | Chande et al. | 350/6.6 |
| 5,583,688 A | 12/1996 | Hornbeck | 359/291 |
| 5,600,383 A | 2/1997 | Hornbeck | 348/771 |
| 5,783,340 A | 7/1998 | Farino et al. | 430/22 |
| 5,798,283 A | 8/1998 | Montague et al. | 438/24 |

(List continued on next page.)

FOREIGN PATENT DOCUMENTS

| | | | |
|---|---|---|---|
| JP | 06-160750 | 6/1994 | G02B/26/10 |
| JP | 2617054 | 6/1997 | G92B/26/08 |
| WO | WO 99/66354 | 12/1999 | |

OTHER PUBLICATIONS

Lucent technologies WaveStar LambdaRouter Brouchure Jan. 2000, 6 Pages.
"Multiple Solutions In Electrostatic Mems" J.A. Pelesko, Modeling and Simulation of Microsystems Mar. 2001 (pp. 290–293).

(List continued on next page.)

*Primary Examiner*—Karl Tamai
(74) *Attorney, Agent, or Firm*—Marsh Fischmann & Breyfogle LLP

(57) ABSTRACT

The present invention provides a MEM system (10) having a platform (14) that is both elevatable from the substrate (12) on which it is fabricated and tiltable with one, two or more degrees of freedom with respect to the substrate (12). In one embodiment, the MEM system (10) includes the platform (14), a pair of A-frame structures (40), and two pairs of actuators (30) formed on the substrate (12). Ends (46A) of rigid members (46) extending from apexes (40A) of the A-frame structures (40) are attached to the platform (14) by compliant members (48A, 48B). The platform (14) is also attached to the substrate (12) by a compliant member (48C). The A-frame structures (40) are separately pivotable about bases (40B) thereof. Each pair of actuators (30) is coupled through a yoke (32) and displacement multiplier (34) to one of the A-frame structures (40) and is separately operable to effect pivoting of the A-frame structures (40) with respect to the substrate (12) by equal or unequal angular amounts. Upon pivoting, the A-frame structures (40) act as lever arms to both lift the platform (14) and tilt the platform (14) with respect to the substrate (12) with at least one degree of freedom. Since the platform (14) lifts up from the surface of the substrate (12), it may be tilted at large angles with respect to the substrate (12).

26 Claims, 10 Drawing Sheets

U.S. PATENT DOCUMENTS

| | | | | |
|---|---|---|---|---|
| 5,804,084 | A | | 9/1998 | Nasby et al. .................... 216/2 |
| 5,867,302 | A | | 2/1999 | Fleming ..................... 359/291 |
| 5,870,007 | A | * | 2/1999 | Carr et al. ................... 333/262 |
| 5,875,271 | A | | 2/1999 | Laughlin ..................... 385/16 |
| 5,959,375 | A | | 9/1999 | Garcia ........................ 310/40 |
| 5,960,132 | A | | 9/1999 | Lin ............................. 385/18 |
| 5,986,381 | A | | 11/1999 | Hoen et al. ................. 310/309 |
| 6,082,208 | A | | 7/2000 | Rodgers et al. ............... 74/406 |
| 6,097,859 | A | | 8/2000 | Solgaard et al. .............. 385/17 |
| 6,133,670 | A | | 10/2000 | Rodgers et al. ............. 310/309 |
| 6,175,170 | B1 | | 1/2001 | Kota et al. .................... 310/40 |
| 6,201,629 | B1 | | 3/2001 | McClelland et al. ........ 359/223 |
| 6,211,599 | B1 | | 4/2001 | Barnes et al. ............... 310/309 |
| 6,220,561 | B1 | * | 4/2001 | Garcia ........................ 248/487 |
| 6,253,001 | B1 | * | 6/2001 | Hoen .......................... 385/17 |
| 6,289,145 | B1 | | 9/2001 | Solgaard et al. .............. 385/17 |
| 6,309,077 | B1 | | 10/2001 | Saif et al. .................... 359/871 |
| 6,310,339 | B1 | | 10/2001 | Hsu et al. ................. 250/214.1 |
| 6,327,398 | B1 | | 12/2001 | Solgaard ..................... 385/18 |
| 6,329,738 | B1 | | 12/2001 | Hung ......................... 310/309 |
| 6,366,414 | B1 | * | 4/2002 | Aksyuk et al. ............. 359/822 |
| 6,466,711 | B1 | | 10/2002 | Laor et al. .................... 385/18 |
| 6,483,962 | B1 | | 11/2002 | Novotny ..................... 385/18 |
| 6,526,198 | B1 | * | 2/2003 | Wu et al. ..................... 385/18 |
| 6,545,385 | B2 | * | 4/2003 | Miller et al. ................ 310/309 |
| 6,637,901 | B2 | * | 10/2003 | Rodgers ..................... 359/872 |
| 6,650,806 | B2 | * | 11/2003 | Rodgers et al. ............... 385/18 |
| 6,665,104 | B2 | * | 12/2003 | Rodgers et al. ............. 359/224 |
| 2001/0048265 | A1 | | 12/2001 | Miller et al. ................ 310/309 |
| 2001/0051015 | A1 | | 12/2001 | Gutierrez et al. ............. 385/17 |
| 2002/0044718 | A1 | | 4/2002 | Nishi et al. ................... 385/17 |
| 2002/0076138 | A1 | | 6/2002 | Tew ............................ 385/18 |
| 2002/0122619 | A1 | | 9/2002 | Sandler et al. ................ 385/17 |
| 2002/0164113 | A1 | | 11/2002 | Rensing et al. ............... 385/18 |

OTHER PUBLICATIONS

"An Angle Based Design Approach For Rectangular Electrostatic Torsion Actuators", Zhixiong Xiao et al., New Jersey Institute of Technology, Microelectronics Research Center, (pp. 1–27) Dec. 2001, Journal of MEMS.

"Mems Technologies For Optical Applications", Dr. Veljko Milanovic, Adriatic Research Institute, Dec. 2002.

"Optical Mems Design For Telecommunications Applications" Vladimir A. Aksyk et al., Solid–State Sensor, Actuator and Microsystems Workshop, Hilton Island, South Carolina, Jun. 2002 (pp. 1–6).

"Microelectromechanical Systems Laboratory Manual", NJIT PHYS 482 and Columbia ME4312, Prof. Farmer (NJIT) and Prof. Mode (Columbia), (pp. 1–17) Aug. 2001.

* cited by examiner

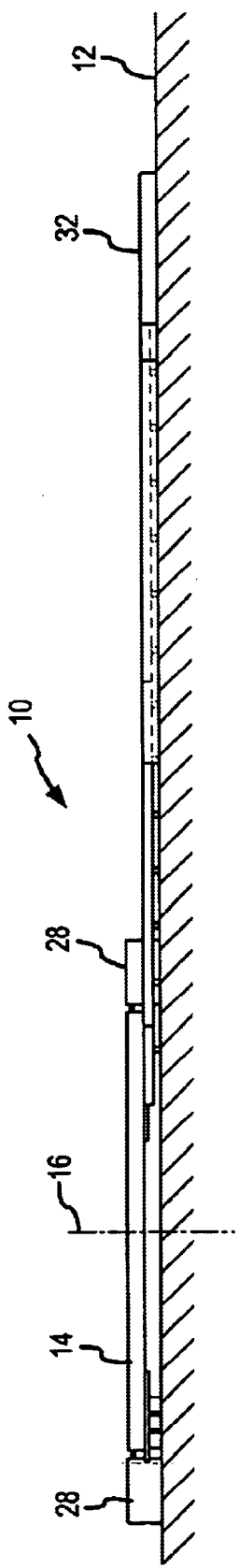
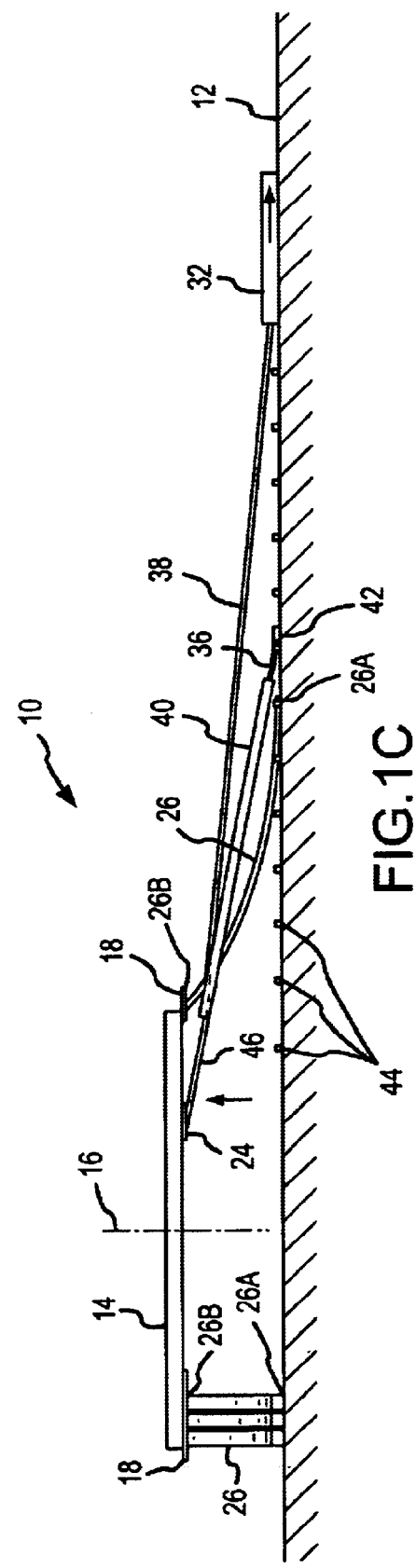

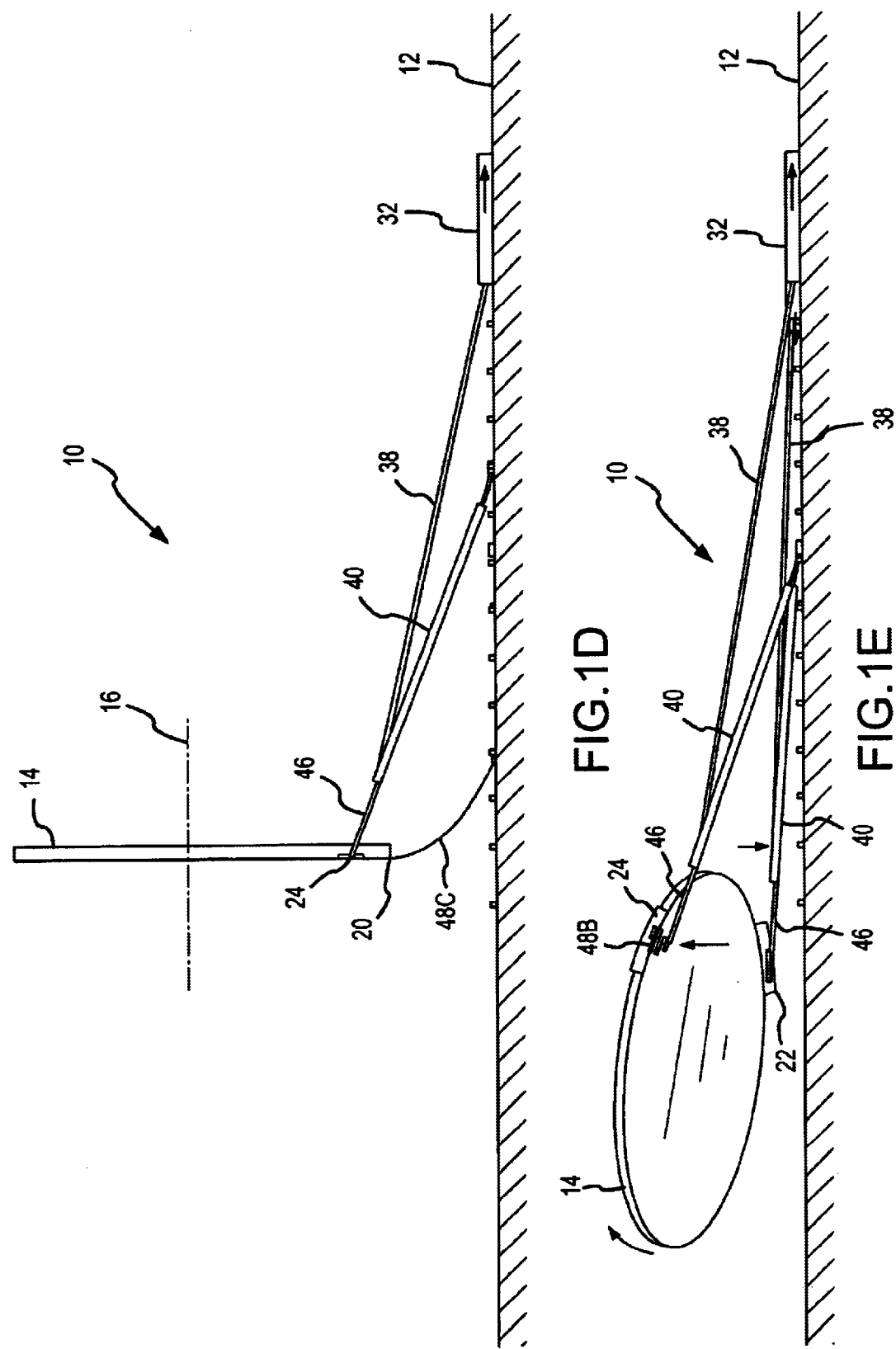

MICROELECTROMECHANICAL SYSTEM FOR TILTING A PLATFORM

RELATED APPLICATION INFORMATION

This application is a divisional of and claims priority from U.S. patent application Ser. No. 09/966,963 entitled "LARGE TILT ANGLE MEM PLATFORM" filed on Sep. 27, 2001, the entire disclosure of which is hereby incorporated herein by reference.

FIELD OF THE INVENTION

The present invention relates generally to microelectromechanical systems, and more particularly to a microelectromechanical system having a platform which can be selectively elevated above a supporting substrate and tilted at large angles with respect to the substrate.

BACKGROUND OF THE INVENTION

The use of microelectromechanical (MEM) systems has grown in conjunction with the ability to fabricate increasingly complex MEM systems. MEM systems have many applications including in free-space reflective-type optical cross connect switch devices. In such devices, MEM systems fabricated on one or more substrates typically include an optically reflective surface or coating upon a platform that can be tilted with respect to the substrate. Two or more MEM systems are operated to tilt respective platforms thereof with respect to the substrate to provide a reflective optical signal pathway between selected optical ports of the switch. As may be appreciated, the number of side-by-side optical ports that can be reflectively interconnected within such a switch and how close the optical ports can be to the surface of the substrate depend upon a number of factors, including how far each optically reflective platform can be tilted with respect to the substrate.

SUMMARY OF THE INVENTION

Accordingly, the present invention provides a MEM system having a platform that may be simultaneously elevated from the substrate on which it is fabricated and tilted with one, two or more degrees of freedom with respect to the substrate in a controlled manner by operating one or more actuator microstructures formed on the substrate that are mechanically coupled with the platform. The term "substrate" as used herein means those types of structures that can be handled by the types of equipment and processes that are used to fabricate micro-devices on, within, and/or from the substrate using one or more micro photolithographic patterns. Since the platform lifts up from the surface of the substrate, it may be tilted at large angles (e.g., in excess of forty-five degrees or even in excess of ninety degrees) with respect to the substrate without being restricted by contact between the periphery of the platform and the surface of the substrate.

The MEM system of the present invention can be configured to serve a number of functions where it is necessary to position an optical element at large angles with respect to the substrate. For example, with an optically reflective surface or coating on the platform, multiple MEM systems may be incorporated into a free-space reflective-type optical cross connect switch that requires large tilt angles in order to connect optical ports thereof. The platform may also include other optical elements such as, for example, a diffraction grating, a lens or an optical polarizer depending upon the application in which the MEM system is employed. The platform can also serve as an optical shutter for use in blocking optical signals by tilting the platform into a position where it blocks the path of the optical signals.

According to one aspect of the present invention, a large tilt angle MEM system includes a substrate, a platform formed on the substrate and a lever arm formed on the substrate. The substrate may, for example, be comprised of silicon (e.g., a silicon wafer or a portion thereof). The platform and lever arm may be fabricated on the surface of the substrate in accordance with surface micromachining techniques from multiple patterned layers of monocrystalline or polycrystalline silicon with intervening patterned layers of sacrificial oxide deposited on the substrate.

The entire platform is elevatable to a desired height from the substrate (i.e., no portion of the platform is prevented from being lifted off of the substrate) and may also be pivotably attached to the substrate. In this regard, the MEM system may include a first compliant member (e.g., a spring) attaching the platform to the substrate. The first compliant member attaches the platform to the substrate while permitting the platform to be elevated to the desired height from the substrate. The first compliant member also allows the platform to be tilted with respect to the substrate with at least one degree of freedom.

The lever arm is pivotably attached to the substrate in a manner that permits the lever arm to pivot in at least a first direction (e.g., clockwise or counter-clockwise) with respect to the substrate. The lever arm is also coupled with the platform in a manner such that, in response to pivoting of the lever arm in the first direction, the platform is inclined in at least the first direction. In this regard, the lever arm may be coupled with the platform by a second compliant member (e.g., a spring). Upon pivoting of the lever arm in the first direction, the second compliant member transmits force from the lever arm to the platform both lifting the platform and creating a rotational torque that tilts the platform in the first direction with respect to the substrate. In this regard the second complaint member should be sufficiently rigid both laterally and torsionally. Since the point on the lever arm where the second compliant member is connected may swing through a first arc having a different radius than a second arc through which a point on the platform where the second compliant member is connected swings, the second complaint member should also elongate and contract lengthwise. Pivoting of the lever arm in the opposite direction lowers the platform and declines it from the tilted orientation.

The platform may be attached to the substrate and the lever arm in a manner that provides for a change in an angle of inclination of the platform in the first direction with respect to the substrate which exceeds a change in an angle of pivot of the lever arm in the first direction with respect to the substrate upon pivoting of the lever arm in the first direction with respect to the substrate. In this regard, the platform may be attached to the substrate at a first location and the lever arm may be attached to the platform at a second location and to the substrate at a third location, with the first location being between the second and third locations when the platform is in a non-tilted orientation with respect to the substrate. It is also possible to attach the platform to the substrate and the lever arm in a manner that provides for a change in an angle of inclination of the platform in the first direction with respect to the substrate which is less than a change in an angle of pivot of the lever arm in the first direction with respect to the substrate upon pivoting of the lever arm in the first direction with respect to the substrate. In this regard, the platform may be attached to the substrate at a first location and the lever arm may be attached to the platform at a second location and to the substrate at a third location, with the third location being between the first and second locations when the platform is in a non-tilted orientation with respect to the substrate.

In one embodiment, the lever arm comprises an A-frame structure. The base of the A-frame structure may be attached to the substrate by one or more flexible members. The flexible member(s) is/are configured to permit pivoting of the A-frame structure about its base in at least the first direction with respect to the substrate. In this regard, the flexible member(s) may permit the A-frame structure to be rotated in only a clockwise/counterclockwise direction about an axis parallel with the plane of the substrate while restricting rotation of the A-frame structure about an axis perpendicular to the substrate. The apex of the A-frame structure may be coupled to the platform by the second compliant member or the A-frame structure may include a rigid member that extends from the apex of the A-frame portion of the A-frame structure that is then coupled to the platform by the second compliant member.

In order to achieve pivoting of the lever arm, the MEM system may include an actuator microstructure that is formed on the substrate. The actuator microstructure is coupled to the lever arm and operable to effect pivoting of the lever arm in at least the first direction with respect to the platform. In this regard, a laterally moveable output (i.e., an output that moves generally parallel with the plane of the surface of the substrate) of the actuator microstructure may be coupled with the lever arm by a tether. One end of the tether is attached to the moveable output of the actuator microstructure and the other end of the tether is attached to the lever arm between the second and third locations. When the actuator microstructure is operated, the tether pulls the lever arm thereby pivoting the lever arm with respect to the substrate.

In order to generate sufficient force, the actuator microstructure may be comprised of a plurality of separate actuators such as, for example, a plurality of electrostatic actuators operable in response to a control voltage applied across terminals thereof. The laterally moveable outputs of the separate actuators may be coupled together by a laterally moveable yoke formed on the substrate. In this regard, the tether is attached to the yoke so that the combined force of the separate actuators is applied via the tether to the lever arm. Since the lateral movement that may be achieved with an electrostatic actuator or the like may be small, the MEM system may also include a displacement multiplier between the yoke and the tether. The displacement multiplier amplifies the lateral movement of the yoke into larger lateral movement of the tether thereby achieving substantial pivoting of the lever arm with only small lateral movement of the yoke.

Prior to use of the MEM system, it may be desirable to inhibit unintended movement of the platform which might cause damage to the platform or other components of the MEM system. In this regard, the MEM system may include one or more fuses securing the platform to the substrate. Upon application of an appropriate voltage across the fuse(s), the fuse(s) are melted or vaporized thereby freeing the platform from the substrate to be lifted and tilted. The fuse(s) may also be removed using a laser cutter or other similar device. The MEM system may also include one or more pre-stressed elevators attached to the substrate and in contact with platform or lever arm. Upon melting/vaporization or cutting of the fuse(s), the pre-stressed elevator(s) curl upward thereby elevating the platform to a predetermined initial height from the substrate where it can be further lifted and also tilted by the lever arm.

According to another aspect of the present invention, a MEM system includes a substrate, a platform formed on the substrate and first and second lever arms formed on the substrate. The platform includes first, second and third attachment points. The platform may be attached to the substrate at the first attachment point of the platform. The first lever arm is attached to the platform at the second attachment point. The second lever arm is attached to the platform at the third attachment point thereof. In this regard, the first and second lever arms may be attached to the platform by compliant members (e.g., springs) and the platform may also be attached to the substrate by a compliant member (e.g., a spring). The first and second lever arms are also pivotably attached to the substrate at first and second anchor points, respectively, on the substrate. The first attachment point is located on the same side of an imaginary line intersecting the second and third attachment points as the first and second anchor points are located when the platform is in a non-tilted orientation with respect to the substrate. In this regard, the first attachment point may be located between the imaginary line intersecting the second and third attachment points and another imaginary line intersecting the first and second anchor points to achieve generally larger changes in the angle of inclination of the platform with respect to the substrate than the angle through which the first and second lever arms are moved. Alternatively, the first attachment point may be located on the opposite side of the imaginary line intersecting the first and second anchor points to achieve generally smaller changes in the angle of inclination of the platform with respect to the substrate than the angle through which the first and second lever arms are moved. It will be appreciated that the latter location of the first attachment point allows for more precise control of the angle of inclination of the platform in comparison with the former location.

The first and second lever arms are separately pivotable about the first and second anchor points, respectively, by unequal angular amounts to tilt the platform with respect to the substrate with at least two degrees of freedom. In this regard, the MEM system may include first and second actuator microstructures formed on the substrate. The first actuator microstructure is coupled (e.g., by a tether) to the first lever arm and is operable to effect pivoting of the first lever arm with respect to the substrate. The second actuator microstructure is coupled (e.g., by a tether) to the second lever arm and is operable to effect pivoting of the second lever arm with respect to the substrate. The first and second actuator microstructures may be electrostatic actuators that are operable in response to control voltages applied across terminals thereof. In this regard, the platform may be tilted with respect to the substrate with only one degree of freedom by applying the same level control voltage across the terminals of the first and second actuator microstructures. By applying unequal control voltages across the terminals of the first and second actuator microstructures, the platform may be tilted with two degrees of freedom. It is also possible to fabricate the MEM system with the first and second lever arms having non-symmetric geometries (e.g., differing lengths or locations where the tethers are attached) so that application of equal control voltages achieves tilting of the platform with two degrees of freedom.

According to a further aspect of the present invention, a MEM system includes a substrate, a platform formed on the substrate, one or more tethers formed on the substrate, and one or more compliant members formed on the substrate pivotably attaching the platform to the substrate. The tether (or each tether, if more than one) is laterally moveable with respect to the substrate in a direction parallel with a lengthwise axis of the tether and is coupled at one end thereof to the platform by a compliant member. The compliant member(s) pivotably attaching the platform to the substrate is/are configured to permit the entire platform to be elevated from the substrate. In this regard, the platform may include a frame portion extending laterally therefrom, with the frame portion being attached at a first point thereof by a first compliant member to the tether and pivotably attached to the substrate at second and third points thereof by second and third compliant members. The first, second and third compliant members may comprise segmented torsional springs. The second and third points of the frame portion may be located between the first point where the frame portion is attached to the tether by the first compliant member and an end of the tether opposite the end of the tether attached to the frame portion. In response to lateral movement of the tether away from the platform, the platform swings up and away from the platform. Likewise, in response to lateral movement of the tether towards the platform, the platform swings down towards the substrate.

According to yet another aspect of the present invention, a microelectromechanical system includes a substrate, a platform formed on the substrate, and first and second lever arms also formed on the substrate. The first lever arm is attached to the platform by one or more compliant members and is also pivotably attached to the substrate at a first anchor point on the substrate. The second lever arm is attached to the platform by one or more compliant members and is also pivotably attached to the substrate at a second anchor point on the substrate. The platform is not attached to the substrate (other than indirectly through the lever arms). The first and second lever arms are simultaneously pivotable about the first and second anchor points, respectively, in at least a first direction (e.g., clockwise or counter-clockwise) by equal angular amounts to incline the platform in at least the first direction. The first and second lever arms are also separately pivotable about the first and second anchor points, respectively, by unequal angular amounts to tilt the platform with respect to the substrate with at least two degrees of freedom.

These and other aspects and advantages of the present invention will be apparent upon review of the following Detailed Description when taken in conjunction with the accompanying figures.

DESCRIPTION OF THE DRAWINGS

For a more complete understanding of the present invention and further advantages thereof, reference is now made to the following Detailed Description, taken in conjunction with the drawings, in which:

FIG. 1B shows a schematic side view of the MEM system of FIG. 1A prior to elevation of the platform from the substrate;

FIG. 1C shows a schematic side view of the MEM system of FIG. 1A with the platform elevated from the substrate;

FIG. 1D shows a schematic side view of the MEM system of FIG. 1A with the platform elevated from the substrate and tilted with one degree of freedom;

FIG. 1E shows a schematic side view of the MEM system of FIG. 1A with the platform elevated from the substrate and tilted with two degrees of freedom;

DETAILED DESCRIPTION

Figure 1A:
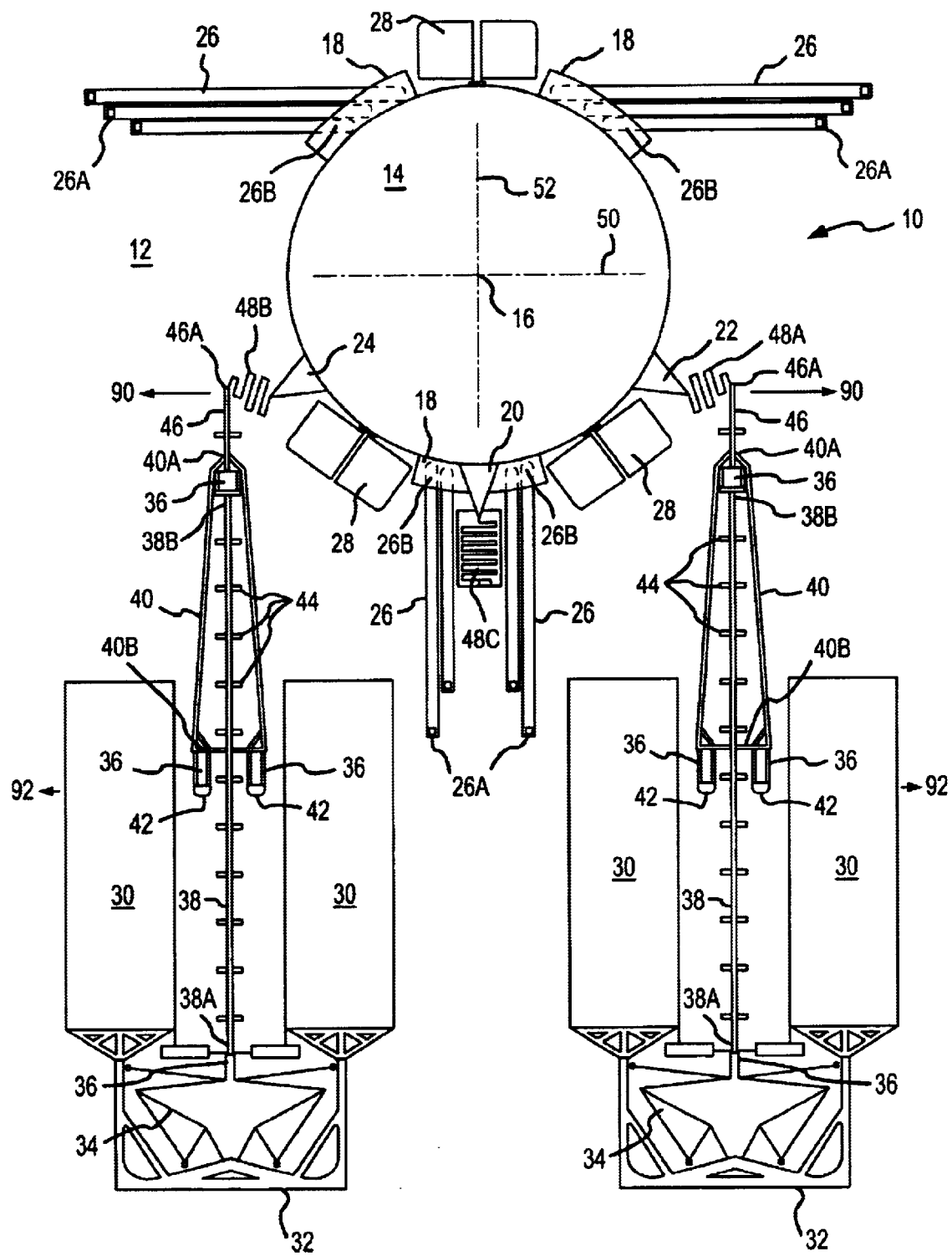
FIG. 1A shows a schematic plan view of a first embodiment of a MEM system in accordance with the present invention.

Referring to FIGS. 1A–E, there are shown schematic plan and several schematic side views of one embodiment of a MEM system 10 in accordance with the present invention. In the schematic side views (FIGS. 1B–E), several components of the MEM system 10 shown in the schematic plan view (FIG. 1A) have not been illustrated for purposes of clarity in the side view illustrations. The MEM system 10 includes a substrate 12 and a platform 14 formed thereon. The platform 14 and other components of the MEM system 10 described below may be fabricated from multiple patterned layers of monocrystalline or polycrystalline silicon with intervening patterned layers of sacrificial oxide deposited on a silicon substrate 12. In this regard, the platform 14 and other components may be fabricated using known surface micromachining techniques such as described in U.S. Pat. No. 5,783,340, issued Jul. 21, 1998, and entitled "METHOD FOR PHOTOLITHOGRAPHIC DEFINITION OF RECESSED FEATURES ON A SEMICONDUCTOR WAFER UTILIZING AUTO-FOCUSING ALIGNMENT"; U.S. Pat. No. 5,798,283, issued Aug. 25, 1998, and entitled "METHOD FOR INTEGRATING MICROELECTROMECHANICAL DEVICES WITH ELECTRONIC CIRCUITRY"; U.S. Pat. No. 5,804,084, issued Sep. 8, 1998, and entitled "USE OF CHEMICAL POLISHING IN MICROMACHINING"; U.S. Pat. No. 5,867,302, issued Feb. 2, 1999, and entitled "BISTABLE MICROELECTROMECHANICAL ACTUATOR"; and U.S. Pat. No. 6,082,208, issued Jul. 4, 2000, and entitled "METHOD FOR FABRICATING FIVE-LEVEL MICROELECTROMECHANICAL STRUCTURES AND MICROELECTROMECHANICAL TRANSMISSION FORMED", the entire disclosures of which are incorporated by reference herein in their entirety. It will be appreciated that in addition to surface micromachining, a number of other microfabrication technologies may be appropriate for use in fabricating the platform 14 and/or other various components of the MEM system 10. Such microfabrication technologies include lithography galvanoforming abforming (LIGA), sacrificial LIGA (SLIGA), bulk micromachining, mold micromachining, micro-electrodischarge machining (EDM), laser micromachining, 3-D stereolithography, and other techniques used to fabricate microstructures on substrates.

As is discussed further below, the platform 14 is both elevatable above the surface of the substrate 12 and tiltable with one or two degrees of freedom with respect to the substrate 12 in order to orient a central axis 16 extending normally from the center of the platform 14 at a desired angle with respect to the plane of the substrate 12. The platform 14 includes a plurality of flaps 18 and first, second and third attachment points 20, 22, 24 that may extend outward beyond the periphery of the platform 14. The upper surface of the platform 14 may be flat and may have an optically reflective coating deposited thereon. In this regard, multiple MEM systems 10 may be arranged in an appropriate manner on one or more substrates 12 to provide, for example, for the switching of optical signals in an optical cross connect switch, the redirection of particular light wavelengths (e.g., red, green, blue) to form a color image in a projection display, or the formation of a multi-element deformable mirror. When the MEM system 10 is intended for other applications, the platform 14 may be configured to include a diffraction grating, an optical polarizer, a lens, or many other elements. Also, the platform 14 may be employed as an optical shutter for use in completely or partially blocking optical signals, in which case the platform 14 need not include any optically reflective coating or other element. Further, the platform 14 may be circular as is illustrated, elliptical, polygonal (e.g., square, hexagonal) or any other appropriate shape and may have a flat profile as is illustrated, a convex profile, a concave profile, or any other desired profile.

A plurality of pre-stressed elevators 26 are formed on the upper surface of the substrate 12. The pre-stressed elevators 26 are organized into several groups arranged about the periphery of the platform 14. The pre-stressed elevators 26 are attached at first ends 26A thereof to the substrate 12. Second ends 26B of the pre-stressed elevators contact the underside of the flaps 18. A plurality of fuses 28 also formed on the substrate 12 are arranged about the periphery of the platform 14. As is shown in FIG. 1B, the fuses 28 hold the platform 14 down during post-processing steps (i.e., after the sacrificial oxide layer(s) have been removed freeing the platform 14 from the substrate 12). This reduces the possibility of inadvertently damaging the platform 14 and other components of the MEM system 10 during post-processing steps. Upon application of an appropriate voltage across the fuses 28, the fuses 28 melt/vaporize thereby releasing the platform 14. As is shown in FIG. 1C, upon melting/vaporization of the fuses 28, the pre-stressed elevators 26 curl upward lifting the entire platform 14 upward to an initial elevated position above the substrate 12. Note that the platform 14 may be parallel with the surface of the substrate 12 in the initial elevated position.

The MEM system 10 also includes two pairs of actuators 30 fabricated on the substrate 12 with a yoke 32 connecting outputs of the two actuators 30 in each pair. The yokes 32 are connected to displacement multipliers 34 which in turn are connected by flexible joints 36 to tethers 38. Each tether 38 extends between its associated displacement multiplier 34 and an associated A-frame structure 40. Each tether 38 is connected by a flexible joint 36 to its associated A-frame structure 40 near an apex 40A of the A-frame portion of the A-frame structure 40. Each A-frame structure 40 is connected at a base 40B thereof by a pair of flexible joints 36 to anchor points 42 formed on the substrate 12. It should be noted that instead of a pair of flexible joints 36 connecting the base 40B of each A-frame structure 40 to an associated pair of anchor points 42, there may be a single wide flexible joint 36 extending across the width of the base 40B of each A-frame structure 40 to connect its base 40B to a single anchor point 42 on the substrate 12 associated with each A-frame structure 40. Such a configuration may provide the A-frame structures 40 with greater overall mechanical stability. To reduce the possibility of stiction between the tethers 38 and the substrate 12, a plurality of humps 44 may be formed on the surface of the substrate 12 underneath each tether 38 to support the tethers 38 above the substrate 12 prior to melting/vaporization of the fuses 28.

The A-frame structures 40 include short rigid members 46 extending from apexes 40A of the A-frame portions of each A-frame structure 40A. An end 46A of the rigid member 46 of one of the A-frame structures 40 is attached by a compliant member 48A to the second attachment point 22 of the platform 14. Likewise, an end 46A of the rigid member 46 of the other A-frame structure 40 is attached by a compliant member 48B to the third attachment point 24 of the platform 14. The compliant members 48A, 48B attaching ends 46A of the rigid members 46 of the A-frame structures 40 to the second and third attachment points 22, 24 of the platform 14 must transmit upward and downward forces to the second and third attachment points 22, 24 as the A-frame structures 40 and rigid members 46 extending therefrom swing upwardly and downwardly with respect to the substrate 12. The compliant members 48A, 48B must also allow the first and second attachment points 22, 24 to swing through smaller or larger radius arcs than the ends of the rigid members 46. Thus, the compliant members 48A, 48B must have lateral and torsional stiffness and an ability to elongate and contract in length. In this regard, the compliant members 48A, 48B may comprise springs.

In addition to being connected at the second and third attachment points 22, 24 to the rigid members 46 extending from the apexes 40A of the two A-frame members 40, the platform 14 is also connected at the first attachment point 20 by another compliant member 48C to the substrate 12. The compliant member 48C attaching the first attachment point 20 of the platform 14 to the substrate 12 must permit the first attachment point 20 of the platform 14 to be elevated to the initial elevated position above the substrate 12, then limit further elevation of the first attachment point 20 so that upon application of upward force at the second and third attachment points 22, 24, a rotational torque will be generated to tilt the platform 14 with respect to the substrate 12. Thus, the compliant member 48C attaching the first attachment point 20 of the platform 14 to the substrate 12 must elongate while providing an increasing contractional force. In this regard, the compliant member 48C may comprise a spring.

As is shown in FIG. 1D, when the actuators 30 are operated, the yokes 32 move laterally across the substrate 12. The lateral movement of the yokes 32 is transmitted and amplified by the displacement multipliers 34 to the tethers 38. It should be noted that, if desired, the displacement multipliers 34 may instead be configured to attenuate the lateral movement of the yokes 32. Lateral movement of the tethers 38 pulls the apexes 40A of the A-frame structures 40 and ends 46A of the rigid members 46 extending therefrom upward rotating the A-frame structures 40 about their bases 40B. In this regard, the A-frame structures 40 function as lever arms applying upward force to the platform 14 through the compliant members 48A, 48B at the second and third attachment points 22, 24. Upward force applied at the second and third attachment points 22, 24 lifts the platform 14 further from the surface of the substrate 12. Also, because the platform 14 is connected by compliant member 48C at the first attachment point 20 to the substrate 12, a rotational force is generated thereby inclining the platform 14 with respect to the substrate 12.

Since the first attachment point 20 is located on the same side of a first imaginary line 90—90 intersecting the locations of the second and third attachment points 22, 24 on the surface of the substrate 12 as the anchor points 42 of the right-side A-frame structure 40, the platform 14 is inclined in the same direction that the right-side A-frame structure 40 rotates when the right-side pair of actuators 30 are operated. Likewise, since the first attachment point 20 is also located on the same side of the first imaginary line 90—90 as the anchor points 42 of the left-side A-frame structure 40, the platform 14 is inclined in the same direction that the left-side A-frame structure 40 rotates when the left-side pair of actuators 30 are operated. As is shown, the first attachment point 20 may be located between the first imaginary line 90—90 intersecting the second and third attachment points 22, 24 and a second imaginary line 92—92 intersecting the anchor points 42 of the left and right-side A-frame structures 40. In this regard, it should be understood that when it is stated herein that the location of the first attachment point 20 is "between" the first and second imaginary lines 90—90, 92—92, "between" the location of the second attachment point 22 and the anchor points 42 of the right-side A-frame-structure 40, or "between" the third attachment point 24 and the anchor points 42 of the left-side A-frame structure 40, it is not required, though it is possible, that the first attachment point 20 be located on a line extending from either the second attachment point 22 and the anchor points 42 of the right-side A-frame-structure 40 or on a line extending from the third attachment point 24 and the anchor points 42 of the left-side A-frame structure 40. Rather, the first attachment point 20 need only be located within a space defined between (and including) two imaginary, parallel planes that are perpendicular to the surface of the substrate 12. The first imaginary line 90—90 intersecting the second and third attachment points 22, 24 lies in one of the planes and the second imaginary line 92—92 intersecting the anchor points 42 of the right-side and left-side A-frame structures 40 lies in the other plane. Further, the locations of the first attachment point 20, second and third attachment points 22, 24, and anchor points 42 may or may not all be within the same horizontal plane.

Although not required, the second and third attachment points 22, 24 may be equidistantly located with respect to the first attachment point 20 as is illustrated. Thus, when equal upward force is applied by the A-frame structures 20 at the second and third attachment points 22, 24 (e.g., by applying equal control voltages to each pair of actuators 30), the platform is tilted about a first axis 50 intersecting and orthogonal to both the central axis 16 and a second axis 52 also intersecting and orthogonal to the central axis 16. Since the first attachment point 20 is located between the first and second imaginary lines 90—90, 92—92, when the actuators 30 are operated to pivot the A-frame structures 40, the change in the angle by which the platform is inclined with respect the substrate 12 is greater than the angle through which the A-frame structures 40 are pivoted. When unequal upward force is applied by the A-frame structures 40 at the second and third attachment points 22, 24 (e.g., by applying unequal control voltages to each pair of actuators 30), the platform 14 will be tilted about both the first axis 50 and the second axis 52. In this regard, the platform 14 may be tilted with only one degree of freedom (i.e. about only the first axis 50 or only the second axis 52) or with two degrees of freedom (i.e., about both the first and second axes 50, 52 at the same time) by the appropriate application of upward force at the second and third attachment points 22, 24. Tilting of the platform 14 with one degree of freedom about the first axis 50 is illustrated in FIG. 1D. Tilting of the platform 14 with two degrees of freedom about both the first and second axes 50, 52 is illustrated in FIG. 1E. Note that in FIG. 1E, the compliant member 48C attaching the platform 14 to the substrate 12 has not been shown. It will be appreciated that since the platform 14 is tilted while the entire platform 14 is elevated from the substrate 12, large tilt angles (e.g., in excess of 45 degrees) about one or both of the first and second axes 50, 52 are possible because the periphery of the platform 14 is not inhibited by contact with the substrate 12.

It should be noted that although in the MEM system 10 illustrated in FIGS. 1A–E, the right and left-side A-frame structures 40, tethers 38, displacement multipliers 34, yokes 32 and actuators 30 are identically configured (e.g., the A-frame structures 40 comprise equal length lever arms), such symmetry is not required where one wants to achieve a particular voltage-to-tilt angle transfer function depending upon, for example, the shape of a target one may want to reflect light to from a reflective surface provided on the platform 14. For example, the lengths of the right and left-side A-frame structures 40 may be different to provide different length lever arms or the tethers 38 can be attached at different locations on right and left-side A-frame structures 40 so that equal applied voltages across the right and left-side pairs of actuators 30 achieves tilting of the platform 14 simultaneously about both axes 50 and 52.

Figure 2:
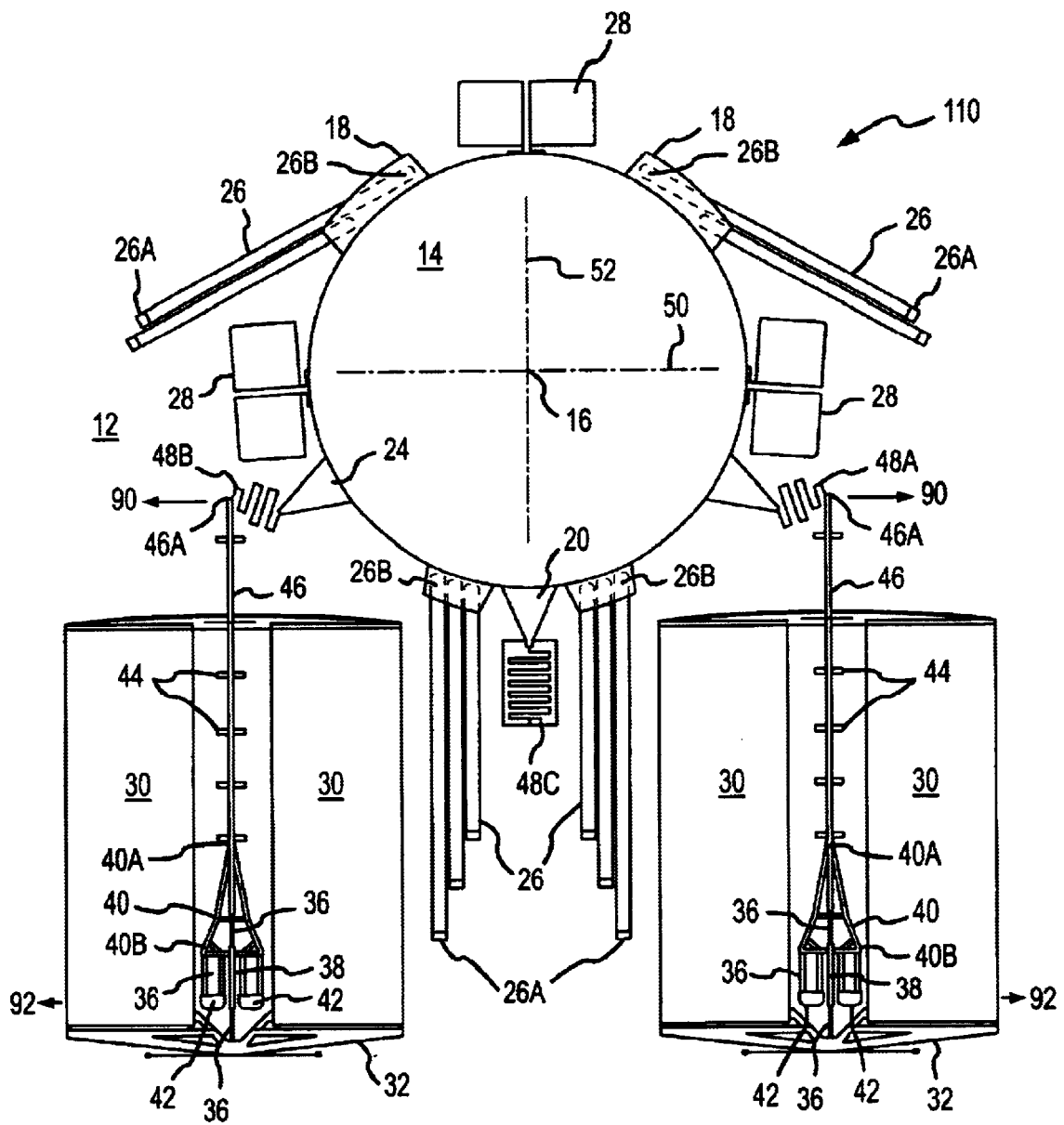
FIG. 2 shows a schematic plan view of a second embodiment of a MEM system in accordance with the present invention.

Referring now to FIG. 2, there is shown a schematic plan view of another embodiment of a MEM system 110 in accordance with the present invention. The MEM system 110 is configured similar to the MEM system 10 illustrated in FIGS. 1A–E. However, the MEM system 110 shown in FIG. 2 does not include displacement multipliers 34. Instead, the A-frame structures 40 are configured differently and the tethers 38 are connected by flexible joints 36 to the A-frame structures 40 nearer to the bases 40B of the A-frame structures 40. The rigid members 46 extending from apexes 40A of the A-frame structures 40 to the compliant members 48A, 48B attaching ends 46A of the rigid members 46 to the second and third attachment points 22, 24 are significantly longer than the rigid members 46 of the embodiment shown in FIGS. 1A–E. Because the tethers 38 are attached near to the bases 40B of the A-frame structures 40, a small lateral movement of the tethers 38 results in a large rotational movement at the ends 46A of the rigid members 46. This allows the tethers 38 to be connected by flexible joints 36 directly to the yokes 32 and eliminates the need for displacement multipliers 34 in order to achieve a large tilt angle of the platform 14 with only small lateral movements achievable from the actuators 30. As with the embodiment of the MEM system 10 illustrated in FIGS. 1A–E, since the first attachment point 20 is located on the same side of the imaginary line 90—90 intersecting the locations of the second and third attachment points 22, 24 as the anchor points 42, the platform 14 is inclined in the same direction that the A-frame structures 40 are rotated. Also, the platform 14 may be tilted with two degrees of freedom by applying unequal upward forces at the second and third attachment points 22, 24.

Figure 3:
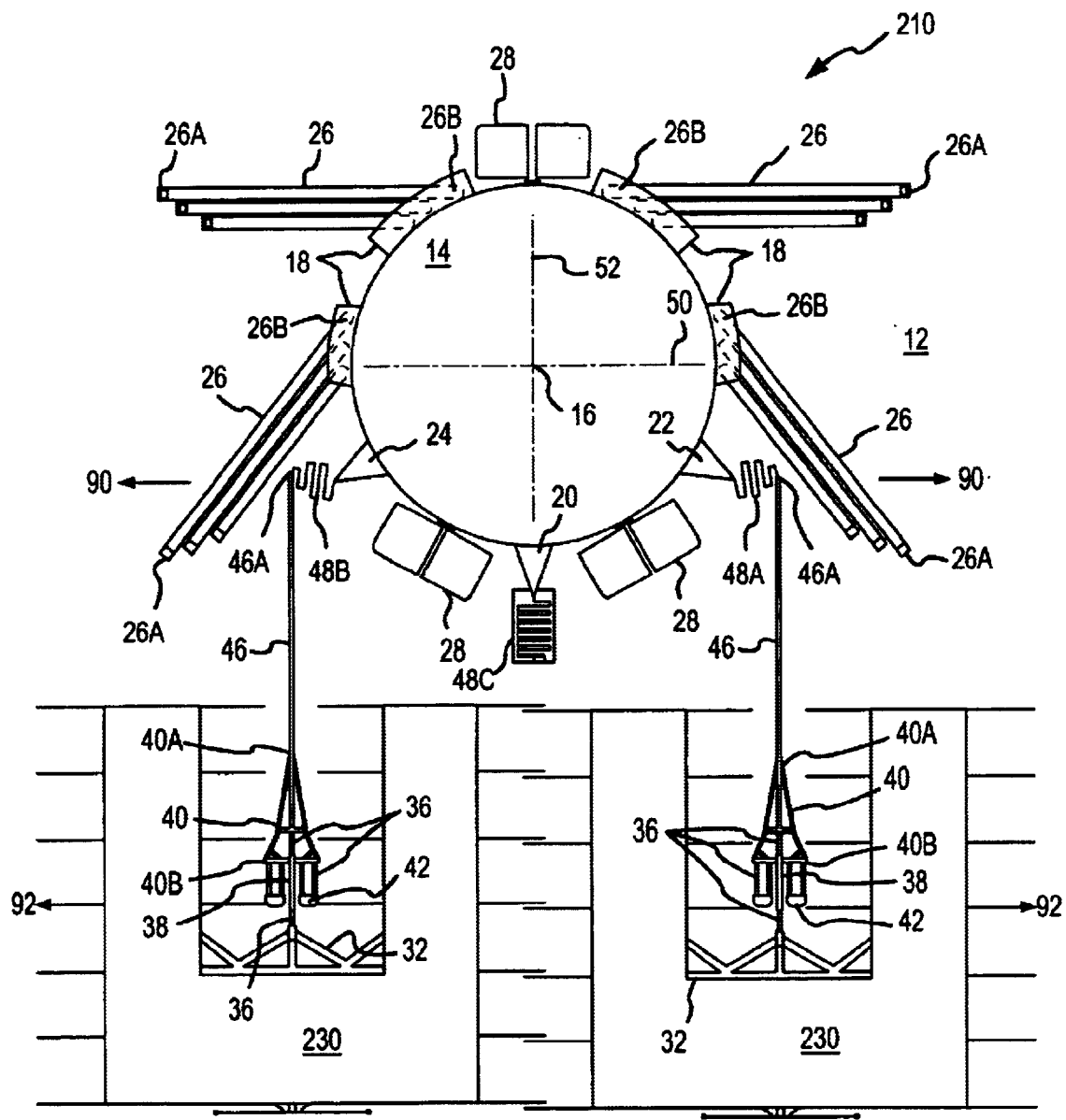
FIG. 3 shows a schematic plan view of a third embodiment of a MEM system in accordance with the present invention.

Referring now to FIG. 3, there is shown a schematic plan view of another embodiment of a MEM system 210 in accordance with the present invention. The MEM system 210 is configured similar to the MEM system 110 illustrated in FIG. 2. However, rather than having a pair of actuators 30 associated with each A-frame structure 40, the MEM system 210 includes a single larger actuator unit 230 associated with each A-frame structure 40. The A-frame structures 40 are configured similar to those in FIG. 2, and the output of each actuator unit 230 is coupled by a yoke 32 via a flexible joint 36 directly (i.e. without an intervening displacement multiplier 34) to an associated tether 38. As with the embodiment illustrated in FIG. 2, the tethers 38 are attached via flexible joints 36 to the A-frame structures 40 near the bases 40B thereof in order to achieve large rotational movement at the ends 46A of the rigid members 46 extending from the apexes 40A of the A-frame structures 40 with only small lateral movement of the tethers 38. Thus, with only small lateral movement achievable by the actuator units 230, the platform 14 can be tilted with one or two degrees of freedom with respect to the substrate 12.

Figure 4:
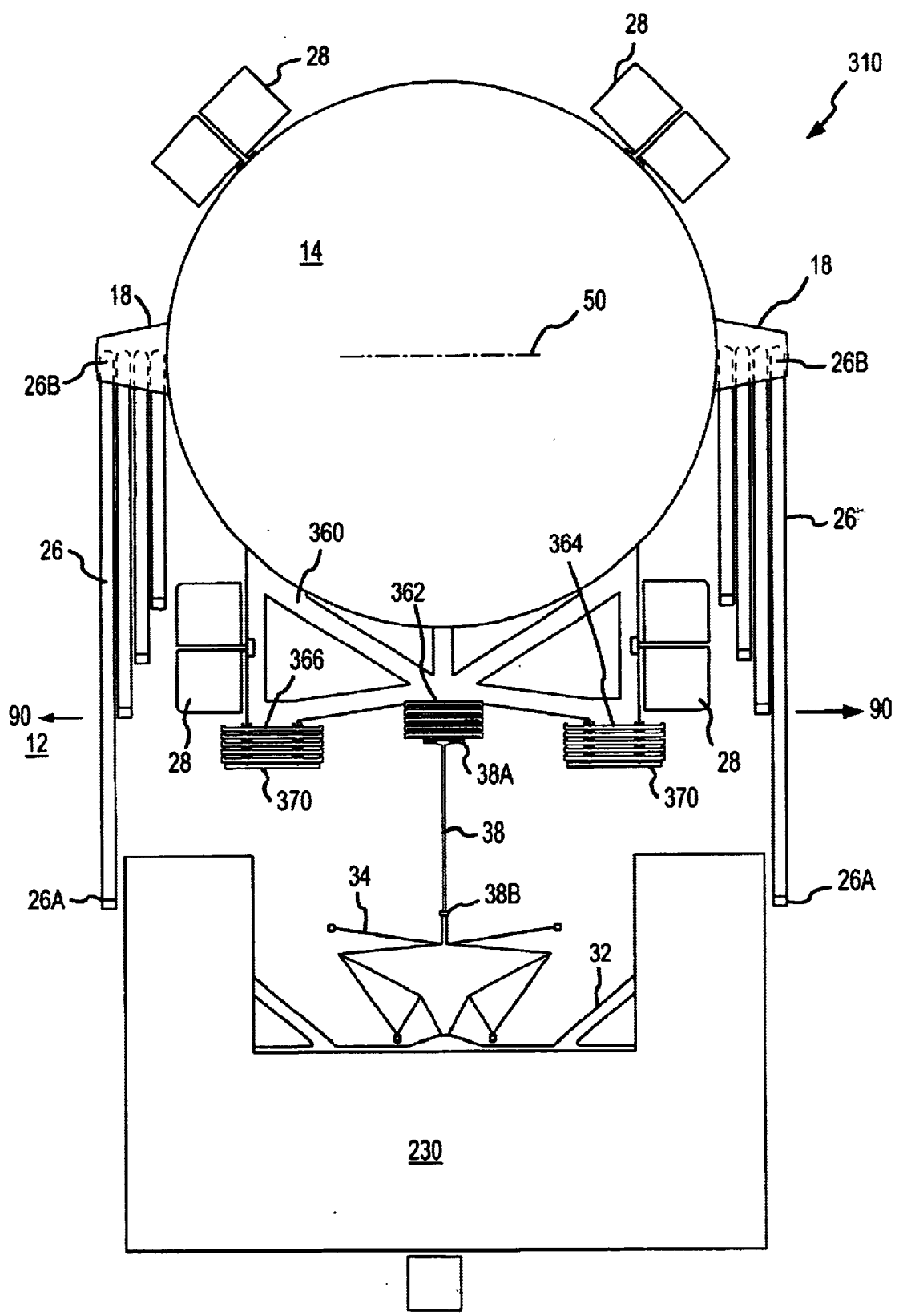
FIG. 4 shows a schematic plan view of a fourth embodiment of a MEM system in accordance with the present invention.

Referring now to FIG. 4, there is shown another embodiment of a MEM system 310 in accordance with the present invention. The MEM system 310 is configured to achieve inclination of the platform 14 with one degree of freedom at a tilt angle exceeding ninety degrees. The MEM system 310 includes a platform 14 with a pair of flaps 18 and an attachment frame 360 that may extend outward from the periphery of the platform 14. Pre-stressed elevators 26 contact the underside of the flaps 18 for lifting the platform 14 to an initial elevated position above the substrate 12 upon melting/vaporization or cutting of the fuses 28 securing the platform 14 and the attachment frame 360 to the substrate 12 during post-processing. The attachment frame 360 is attached at a first point 362 thereof to a tether 38 extending from a displacement multiplier 34 attached to a yoke 32 connecting together the outputs of an actuator unit 230. In this regard, the attachment frame 360 may be attached to the tether 38 by a specially designed compliant member such as a segmented torsional spring 370 described below in connection with FIGS. 5A–C.

The actuator unit 230 may comprise electrostatic actuators that are configured to push the yoke 32 towards the platform 14 upon application of a control voltage thereto. The attachment frame 360 is also attached at second and third points 364, 366 thereof to the substrate 12. In this regard, the attachment frame 360 may be attached to the substrate 12 at the second and third points 364, 366 by specially designed compliant members such as segmented torsional springs 370 described below in connection with FIGS. 5A–C. The attachment frame 360 is shaped so that the first point 362 and the end 38B of the tether 38 that is attached to the displacement multiplier 34 are located on opposite sides of an imaginary line 90—90 on the substrate 12 intersecting the second and third points 364, 366 when the system 10 is in its un-elevated position. A small lateral movement of the yoke 32 towards the platform 14 upon operation of the actuators 30 is amplified and phase-shifted by the displacement multiplier 34 into a larger lateral movement of the tether 38 away from the platform 14. The lateral movement of the tether 38 applies a pulling force at the first point 362 of the attachment frame 360 via the segmented torsional spring 370 causing the attachment frame 360 to pivot about the second and third points 364, 366 thereby tilting the platform 14. In this regard, the platform 14 may be tilted at angles exceeding ninety degrees depending upon the amount of lateral movement of the tether 38 achievable with the actuator unit 230 and displacement multiplier 34.

Since the first point 362 of the attachment frame 360 and the end 38B of the tether 38 that is attached to the displacement multiplier 34 are located on opposite sides of the imaginary line 90—90 on the substrate 12 intersecting the second and third points 364, 366 when the tether 38 moves laterally pulling on the attachment frame 360 at the first point 362, the attachment frame 360 (and hence the platform 14) swings up and away from the substrate 12 becoming inclined to face in the same direction that the tether 38 is pulled. In this regard, it is not required, though it is possible, that the second or third points 364, 366 at which the attachment frame 360 is attached to the substrate 12 be located on a line extending from the first point 362 and the end 38A of the tether 38 attached to the displacement multiplier 34. Rather, the second and third points 364, 366 need only be located within a space defined between two imaginary, parallel planes that are perpendicular to the surface of the substrate 12 and the lengthwise extent of the tether 38. One of the planes intersects the first point 362 and the other plane intersects the end 38A of the tether 38 is attached to the displacement multiplier 34. Further, the locations of the first point 362, second and third points 364, 366, and end of the tether 38A connected to the displacement multiplier 34 may or may not all be within the same horizontal plane.

It should be noted that the MEM system 310 shown in FIG. 4 can be configured in different manners. For example, the separate segmented torsional springs 370 (or other appropriate types of compliant members) attaching the attachment frame 360 to the substrate 12, may extend all the way across the attachment frame 360 between the second and third attachment point 364, 366 to form a single compliant member attaching the, attachment frame 360 to the substrate 12. By way of further example, the end 38A of the tether 38 may be attached to a second yoke 32 which is in turn coupled by one or more segmented torsional springs 370 (or other appropriate compliant members) to the attachment frame 360. Or, there may be multiple parallel tethers 38 connected to separate displacement multipliers 34 connected in parallel to the actuator unit 230, with each tether 38 being connected at ends 38A thereof by separate segmented torsional springs 370 (or other appropriate compliant members) to the attachment frame 360 or through a second yoke 32 via one or more compliant members (e.g., segmented torsional springs 370) to the attachment frame 360.

Figure 5A:
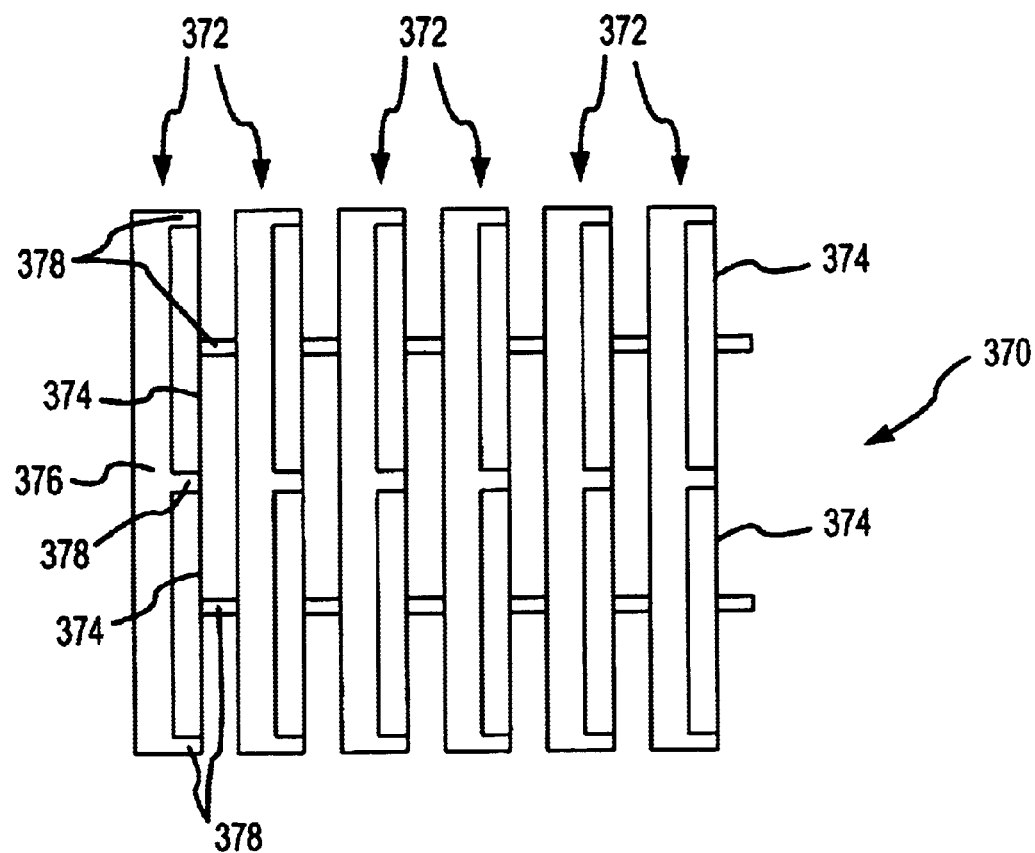
FIGS. 5A, 5B and 5C show plan and side views of one embodiment of a segmented torsional spring compliant member in accordance with the present invention.
Figure 5B:
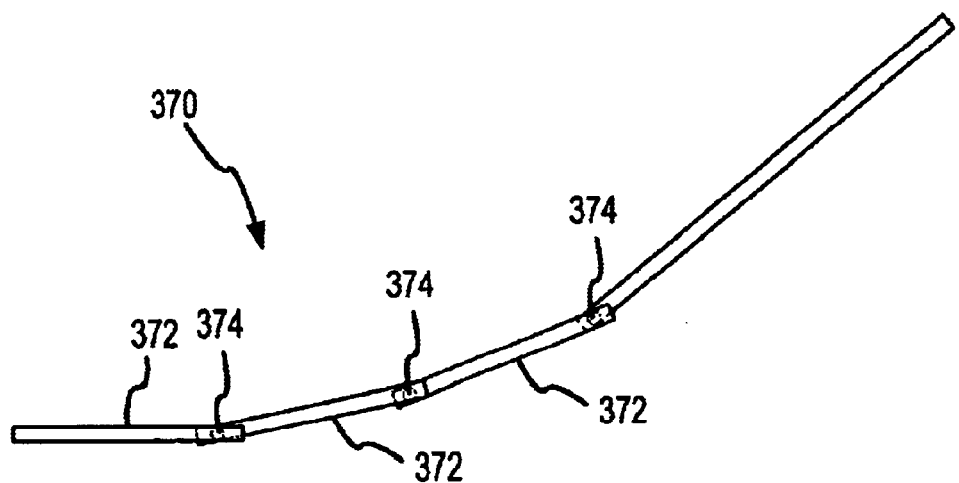
Figure 5C:
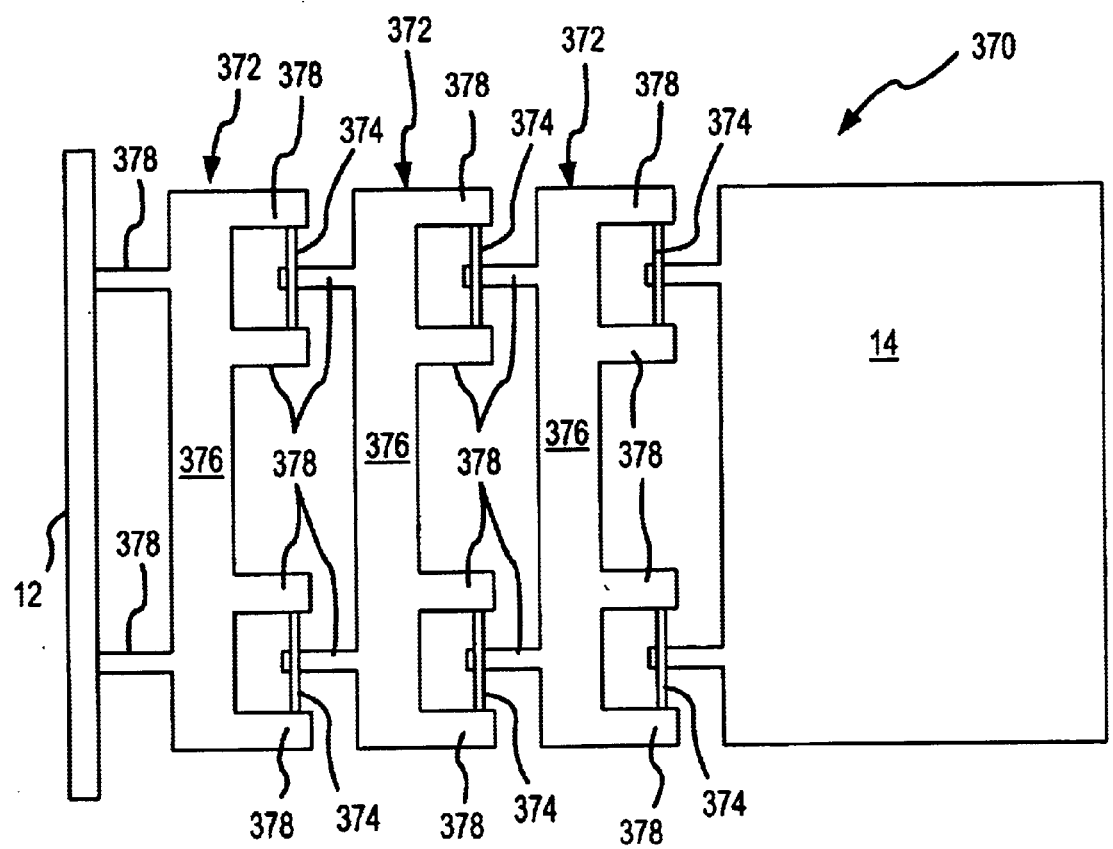

Referring now to FIGS. 5A–C, plan and side views illustrating the construction of a segmented torsional spring 370 are shown. The segmented torsional spring 370 allows for large tilt angles of the platform 14 while maintaining a small radius of curvature of the segmented torsional spring 370. The segmented torsional spring 370 is comprised of a plurality of individual frame members 372 interconnected with each other by a pair of torsional links 374. The frame members 372 may be configured in a number of manners one of which is shown in FIG. 5A. In this regard, each individual frame member 372 includes the main cross member portion 376 having three transverse member portions 378 extending from one side thereof and two transverse member portions 378 extending from the other side thereof. The transverse member portions 378 on each side of the main cross member portion 376 are staggered such that when multiple frame members 372 are arranged in a side-by-side fashion, the two transverse member portions 378 extending from one side of one main cross member portion 376 are located between the center transverse member portion 378 and respective end transverse member portions 378 extending from the side of an adjacent main cross member portion 376. The torsional links 374 extend parallel with the main cross member portions 376 through the two transverse member portions 378 and the three transverse member portions 378. Each frame member 372 is pivotable with one degree of freedom about the torsional links 374 on either side thereof. As is shown in the side view of FIG. 5B, this allows bending of the segmented torsional spring 370 in one direction, but provides significant stiffness in other directions.

FIG. 5C shows a segmented torsional spring 370 connected at one end thereof to an anchor 380 on the substrate 12 and at another end thereof to the platform 14. As is shown, each individual frame member 372 has a main cross member portion 376 having two transverse member portions 378 extending from one side thereof and two pairs of transverse member portions 378 extending from the other side thereof. Separate torsional links 374 pin the two transverse member portions 378 extending from the side of one main cross member portion 376 between the pairs of transverse member portions 378 extending from the facing side of another main cross member portion 376. In addition to the configurations shown in FIGS. 5A–C, many other combinations of main cross member portions 376, transverse member portions 378 and torsional links 374 are possible to form a segmented torsional spring 370.

Figure 6:
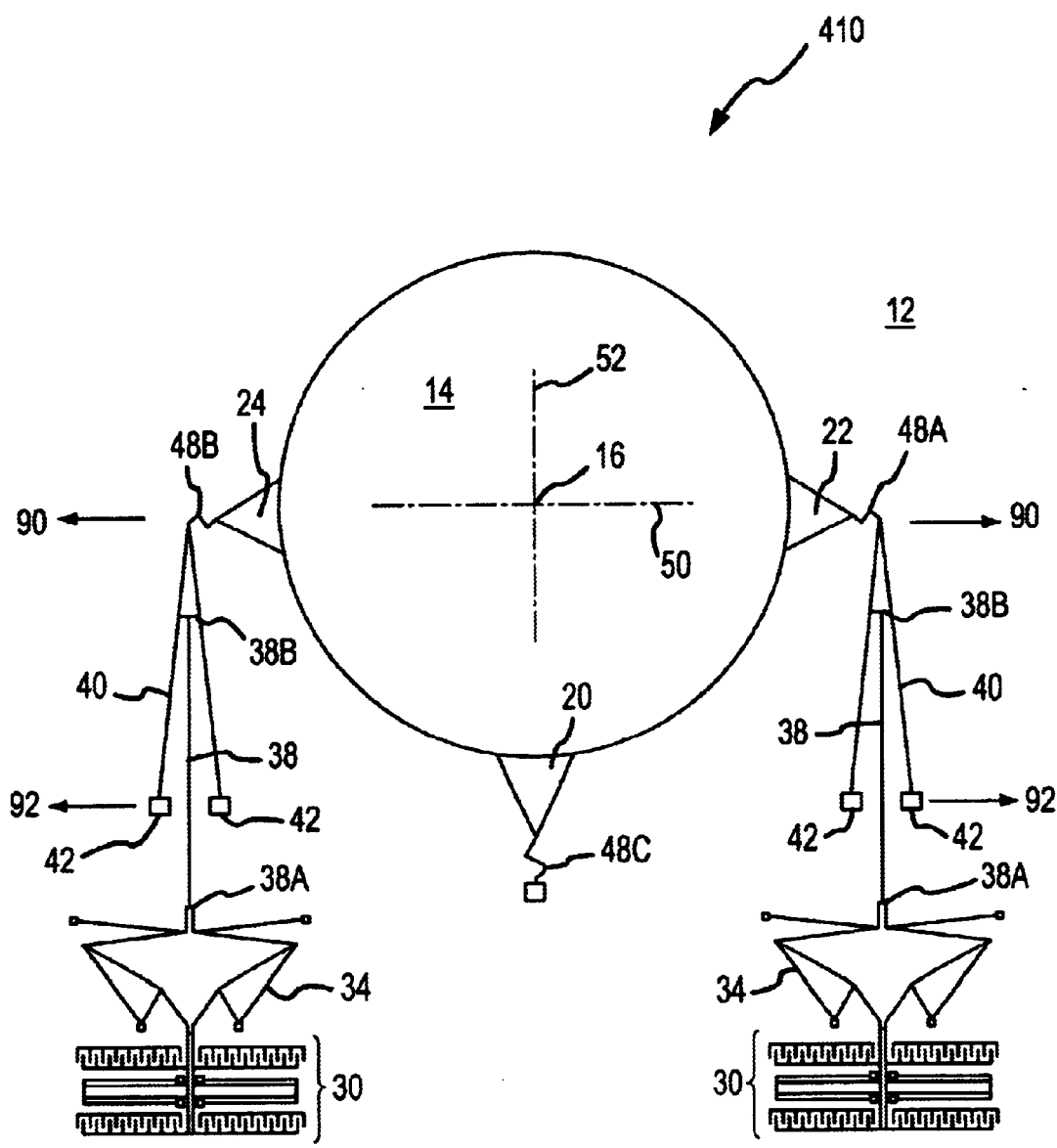
FIG. 6 shows a schematic plan view of an embodiment of a MEM system in accordance with the present invention configured to provide for more precise control of the platform.

Referring now to FIG. 6, there is shown a schematic plan view of another embodiment of a MEM system 410. As with the MEM system 10 shown in FIGS. 1A–E, the MEM system 410 includes a platform 14 having first, second and third attachment points 20, 22, 24, actuators 30, displacement multipliers 34, tethers 38, A-frame structures 40, and compliant members 48A–C formed on a common substrate 12. The actuators 30 shown are electrostatic actuators, but any appropriate actuator microstructures may be employed. Other components that may be included in the MEM system 410, such as pre-stressed elevators and fuses, have not been shown. The components of the MEM system 410 shown in FIG. 6 are arranged similar to that shown in FIGS. 1A–E, however the first attachment point 20 is not located between the imaginary line 90—90 intersecting the second and third attachment points 22, 24 and the imaginary line 92—92 intersecting the anchor points 42 of the A-frame structures 40. Rather, the anchor points 42 of the A-frame structures 40 are located between the imaginary line 90—90 intersecting the second and third attachment points 22, 24 and the first attachment point 20. This arrangement provides for a smaller change in the angle of inclination of the platform 14 with respect to the substrate 12 than the angle through which the A-frame structures 40 are pivoted upon operation of the actuators 30 thus permitting more precise control of the lifting and inclination of the platform 14 in comparison with the embodiment of the MEM system 10 shown in FIGS. 1A–E where the change in the angle of inclination of the platform 14 exceeds the angle through which the A-frame structures 40 are pivoted.

Figure 7:
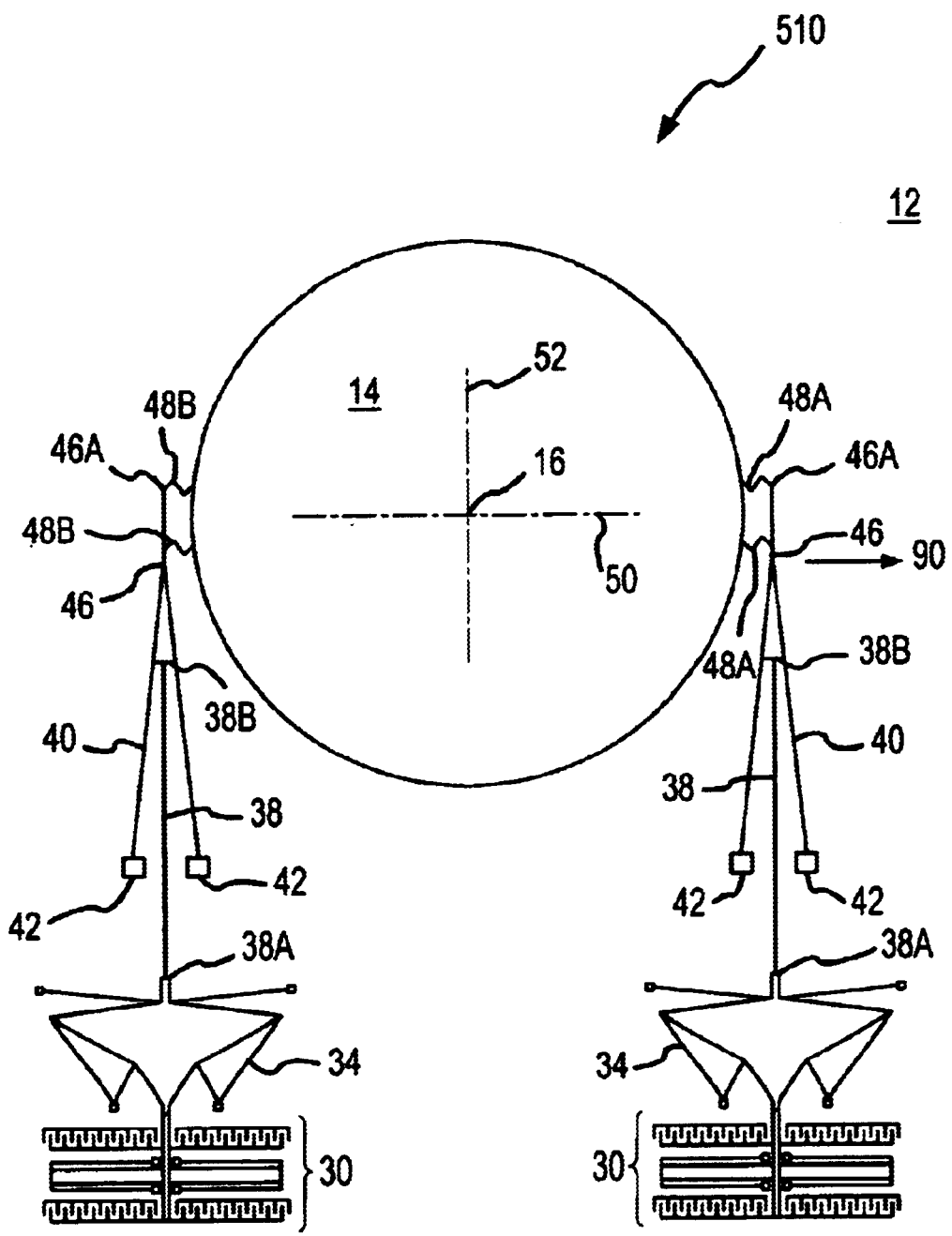
FIG. 7 shows a schematic plan view of another embodiment of a MEM system in accordance with the present invention wherein the platform is not attached to the substrate.

Referring now to FIG. 7, there is shown a schematic plan view of another embodiment of a MEM system 510. Similar to the previously described MEM system 10 shown in FIGS. 1A–E, the MEM system 510 includes a platform 14, actuators 30, displacement multipliers 34, tethers 38, and A-frame structures 40 formed on a common substrate 12. The actuators 30 shown are electrostatic actuators, but any appropriate actuator microstructures may be employed. Other components that may be included in the MEM system 510, such as pre-stressed elevators and fuses, have not been shown. Unlike the previously described MEM systems 10, 110, 210, 310 and 410, the platform 14 of the MEM system 510 of FIG. 7 is not directly attached to the substrate 12 by a compliant member. The platform 14 is only attached to the rigid members 46 extending from the A-frame structures 40. In this case, the rigid member 46 extending from the apex 40A of the right-side A-frame structure 40 is attached to the platform 14 by two compliant members 48A spaced apart from one another on the rigid member 46. Likewise, the rigid member 46 extending from the apex 40A of the left-side A-frame structure 40 is attached to the platform 14 by two compliant members 48B spaced apart from one another on the rigid member 46. However, more or fewer compliant members 48A, 48B may be employed. Upon operation of the actuators 30, the platform 30 lifts up from the substrate 12 and inclines in the same direction that the A-frame structures 40 pivot about their anchor points 42. Because the platform 14 is not attached to the substrate 12, the amount of lift and angle of inclination achieved for a given range of pivoting of the A-frame structures 40 and the resulting voltage-to-angle transfer function of the MEM system 510 may be different than for a similar embodiment where the platform 14 is attached to the substrate 12.

While various embodiments of the present invention have been described in detail, further modifications and adaptations of the invention may occur to those skilled in the art. However, it is to be expressly understood that such modifications and adaptations are within the spirit and scope of the present invention.

What is claimed is:

1. A microelectromechanical system comprising:
   a substrate;
   a platform attached to said substrate in a manner permitting said platform to be elevated in its entirety from said substrate; and
   a lever arm attached to said substrate and pivotable in at least a first direction with respect to said substrate;
   said platform being attached to said lever arm in a manner providing for inclination of said platform in at least the first direction in response to pivoting of said lever arm in the first direction, said lever arm being pivotable in response to an actuation force mechanically coupled thereto and generated without utilizing any portion of said lever arm and said platform.

2. The system of claim 1 wherein said lever arm comprises an A-frame structure.

3. The system of claim 2 further comprising:
   at least one flexible member attaching a base of said A-frame structure to said substrate, said at least one flexible member being configured to permit pivoting of said A-frame structure in at least the first direction with respect to said substrate.

4. The system of claim 1 further comprising:
   a first compliant member attaching said platform to said substrate, said first compliant member being configured to permit elevation of said platform from said substrate to a desired height; and
   a second compliant member attaching said lever arm to said platform, said second compliant member being configured to transmit force from said lever arm to said platform while permitting a point on said lever wherein said second compliant member is connected to swing through a first arc having a different radius than a second arc through which a point on said platform wherein said second compliant member is connected swings.

5. The system of claim 4 wherein the second arc has a smaller radius than the first arc.

6. The system of claim 4 wherein said first and second compliant members comprise springs.

7. The system of claim 1 wherein said platform is attached to said substrate and said lever arm in a manner providing for a change in an angle of inclination of said platform in the first direction with respect to said substrate exceeding a change in an angle of pivot of said lever arm in the first direction with respect to said substrate upon pivoting of said lever arm in the first direction with respect to said substrate.

8. The system of claim 7 wherein said platform is attached to said substrate at a first location, said lever arm is attached to said platform at a second location, and said lever arm is attached to said substrate at a third location, said first location being between said second and third locations.

9. The system of claim 1 further comprising:
an actuator microstructure formed on said substrate, said actuator microstructure being coupled to said lever arm such that said actuator microstructure is operable to effect pivoting of said lever arm in at least the first direction with respect to said substrate.

10. The system of claim 9 wherein said actuator microstructure is operable without external feedback control to effect pivoting of said lever arm in at least the first direction with respect to said substrate such that said platform is inclinable in at least the first direction at any desired angle with respect to said substrate within a specified range of angles.

11. The system of claim 10 wherein the specified range of angles is between zero and ninety degrees.

12. The system of claim 10 wherein said actuator microstructure comprises an electrostatic actuator operable in response to a control voltage applied across terminals thereof.

13. The system of claim 9 further comprising:
a tether coupling a laterally moveable output of said actuator microstructure to said lever arm.

14. The system of claim 13 further comprising:
a displacement multiplier coupling said tether to said laterally moveable output of said actuator microstructure, said displacement multiplier being configured for amplifying lateral movement of said moveable output of said actuator microstructure into larger lateral movement of said tether.

15. The system of claim 13 wherein said actuator microstructure comprises a plurality of separate actuators having separate laterally moveable outputs, and said system further comprises:
a yoke coupling said laterally moveable outputs of said plurality of separate actuators together.

16. The system of claim 1 further comprising:
at least one fuse securing said platform to said substrate, said at least one fuse being configured for releasing said platform from said substrate upon at least one of application of at least a predetermined voltage across said fuse and application of a pulse of electromagnetic energy to said fuse.

17. The system of claim 1 further comprising:
at least one pre-stressed elevator attached to said substrate, said pre-stressed elevator being configured for elevating said platform to a predetermined height from said substrate upon release of said platform.

18. The system of claim 1 wherein said platform is inclinable in at least the first direction at an angle with respect to said substrate exceeding forty-five degrees.

19. The system of claim 1 wherein said platform includes at least one of an optically reflective surface, a diffraction grating, a lens, and an optical polarizer.

20. A microelectromechanical system comprising:
a substrate;
a platform attached to said substrate in a manner permitting said platform to be elevated in its entirety from said substrate; and
a lever arm attached to said substrate and pivotable in at least a first direction with respect to said substrate, said lever arm comprising an A-frame structure;
said platform being attached to said lever arm in a manner providing for inclination of said platform in at least the first direction in response to pivoting of said lever arm in the first direction.

21. The system of claim 20 further comprising:
at least one flexible member attaching a base of said A-frame structure to said substrate, said at least one flexible member being configured to permit pivoting of said A-frame structure in at least the first direction with respect to said substrate.

22. A microelectromechanical system comprising:
a substrate;
a platform attached to said substrate in a manner permitting said platform to be elevated in its entirety from said substrate;
a lever arm attached to said substrate and pivotable in at least a first direction with respect to said substrate;
an actuator microstructure formed on said substrate, said actuator microstructure being coupled to said lever arm such that said actuator microstructure is operable to effect pivoting of said lever arm in at least the first direction with respect to said substrate; and
a tether coupling a laterally moveable output of said actuator microstructure to said lever arm;
said platform being attached to said lever arm in a manner providing for inclination of said platform in at least the first direction in response to pivoting of said lever arm in the first direction.

23. The system of claim 22 further comprising:
a displacement multiplier coupling said tether to said laterally moveable output of said actuator microstructure, said displacement multiplier being configured for amplifying lateral movement of said moveable output of said actuator microstructure into larger lateral movement of said tether.

24. The system of claim 22 wherein said actuator microstructure comprises a plurality of separate actuators having separate laterally moveable outputs, and said system further comprises:
a yoke coupling said laterally moveable outputs of said plurality of separate actuators together.

25. A microelectromechanical system comprising:
a substrate;
a platform attached to said substrate in a manner permitting said platform to be elevated in its entirety from said substrate;
a lever arm attached to said substrate and pivotable in at least a first direction with respect to said substrate; and
at least one fuse securing said platform to said substrate, said at least one fuse being configured for releasing said platform from said substrate upon at least one of application of at least a predetermined voltage across said fuse and application of a pulse of electromagnetic energy to said fuse;
said platform being attached to said lever arm in a manner providing for inclination of said platform in at least the first direction in response to pivoting of said lever arm in the first direction.

26. A microelectromechanical system comprising:
a substrate;
a platform attached to said substrate in a manner permitting said platform to be elevated in its entirety from said substrate;

a lever arm attached to said substrate and pivotable in at least a first direction with respect to said substrate; and at least one pre-stressed elevator attached to said substrate, said pre-stressed elevator being configured for elevating said platform to a predetermined height from said substrate upon release of said platform;

said platform being attached to said lever arm in a manner providing for inclination of said platform in at least the first direction in response to pivoting of said lever arm in the first direction.

* * * * *